United States Patent
Lu et al.

(10) Patent No.: US 10,192,892 B2
(45) Date of Patent: Jan. 29, 2019

(54) ACTIVE MATRIX BACKPLANE FORMED USING THIN FILM OPTOCOUPLERS

(71) Applicant: Palo Alto Research Center Incorporated, Palo Alto, CA (US)

(72) Inventors: JengPing Lu, Fremont, CA (US); David K. Biegelsen, Portola Valley, CA (US); Patrick Yasuo Maeda, San Jose, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 760 days.

(21) Appl. No.: 14/725,472

(22) Filed: May 29, 2015

(65) Prior Publication Data
US 2016/0351584 A1    Dec. 1, 2016

(51) Int. Cl.
*H01L 27/12* (2006.01)
*G02B 26/08* (2006.01)
*G03B 21/00* (2006.01)
*H01L 31/16* (2006.01)

(52) U.S. Cl.
CPC ........ *H01L 27/124* (2013.01); *G02B 26/0833* (2013.01); *G03B 21/008* (2013.01); *H01L 31/16* (2013.01)

(58) Field of Classification Search
CPC ... G03B 21/008; G02B 26/0833; H01L 31/16; H01L 31/173; H01L 27/14625; H01L 27/14627; H01L 27/14629; H01L 27/288; H01L 27/03
See application file for complete search history.

(56) References Cited

U.S. PATENT DOCUMENTS

| | | | |
|---|---|---|---|
| 4,779,126 A | 10/1988 | Herman | |
| 5,028,788 A | 7/1991 | Beland et al. | |
| 5,083,175 A * | 1/1992 | Hack .................. | H01L 31/1136 257/53 |
| 5,200,634 A | 4/1993 | Tsukada et al. | |
| 5,264,720 A | 11/1993 | Muto et al. | |
| 5,880,494 A | 3/1999 | Watanabe | |
| 6,885,789 B2 | 4/2005 | Liu | |

(Continued)

FOREIGN PATENT DOCUMENTS

| | | |
|---|---|---|
| EP | 0361515 | 6/1995 |
| EP | 1711968 | 7/2008 |

OTHER PUBLICATIONS

Huang et al., "Polysilicon Thin Film Transistors with Field-Plate-Induced Drain Junction for Both High-Voltage & Low-Voltage Applications", IEEE, 1990, pp. 177-178.

(Continued)

*Primary Examiner* — Davienne Monbleau
*Assistant Examiner* — Leslie P Cruz
(74) *Attorney, Agent, or Firm* — Hollingsworth Davis, LLC

(57) ABSTRACT

A device includes a backplane having multiple output terminals arranged in an array on an output surface of the backplane. The device further includes an active matrix array comprising thin film solid state optical switches coupled respectively between an input terminal of the backplane and the output terminals. Storage capacitors may be coupled respectively to the output terminals. A pixelated light source provides pixelated light that controls the optical switches.

17 Claims, 17 Drawing Sheets

(56) References Cited

U.S. PATENT DOCUMENTS

| | | | |
|---|---|---|---|
| 7,038,242 | B2 | 5/2006 | Vande Voorde et al. |
| 9,946,135 | B2 * | 4/2018 | Lu et al. ............... G02F 1/1335 |
| 2008/0150069 | A1 | 6/2008 | Popovic et al. |
| 2008/0180633 | A1 * | 7/2008 | Yamada ................... A61B 3/12 |
| | | | 351/220 |
| 2014/0212085 | A1 * | 7/2014 | Margaritis ............. H01L 24/11 |
| | | | 385/14 |

OTHER PUBLICATIONS

File History for U.S. Appl. No. 14/725,443 as retrieved from the U.S. Patent and Trademark Office.

* cited by examiner

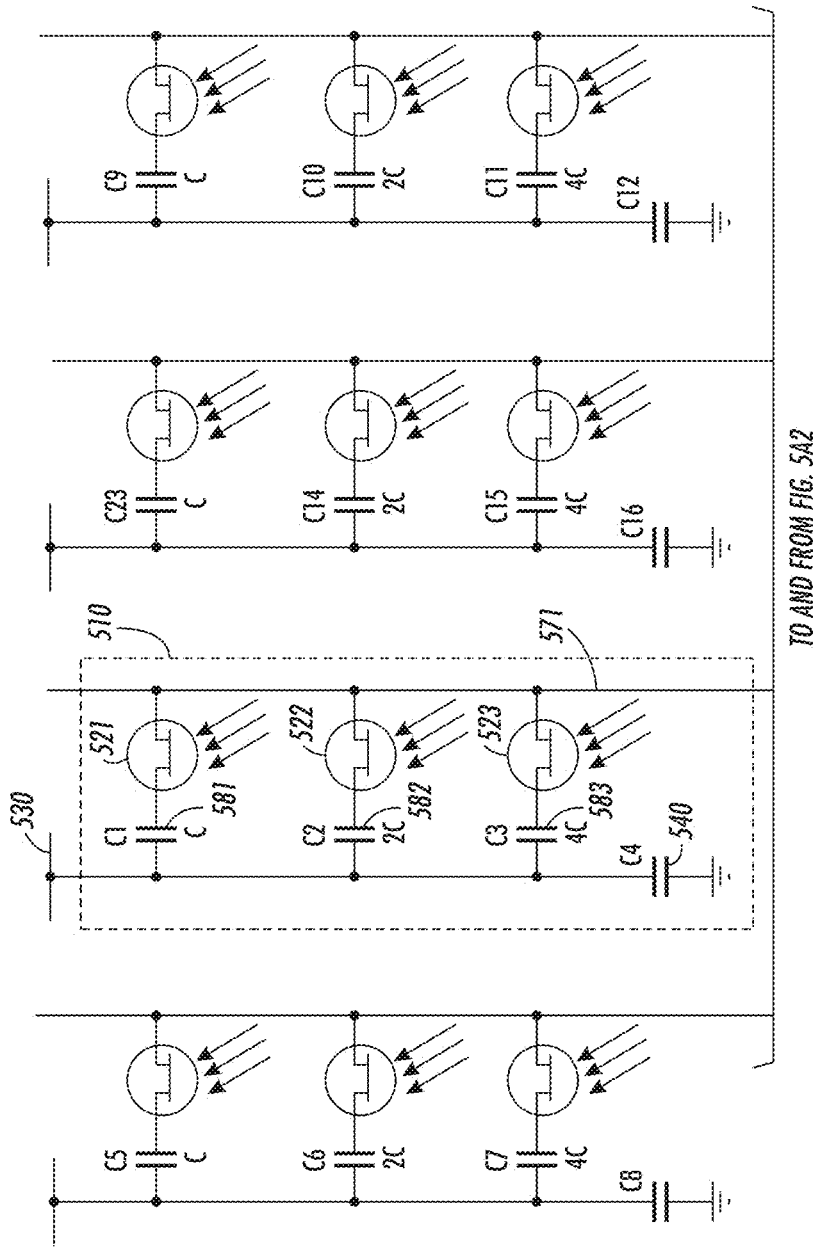

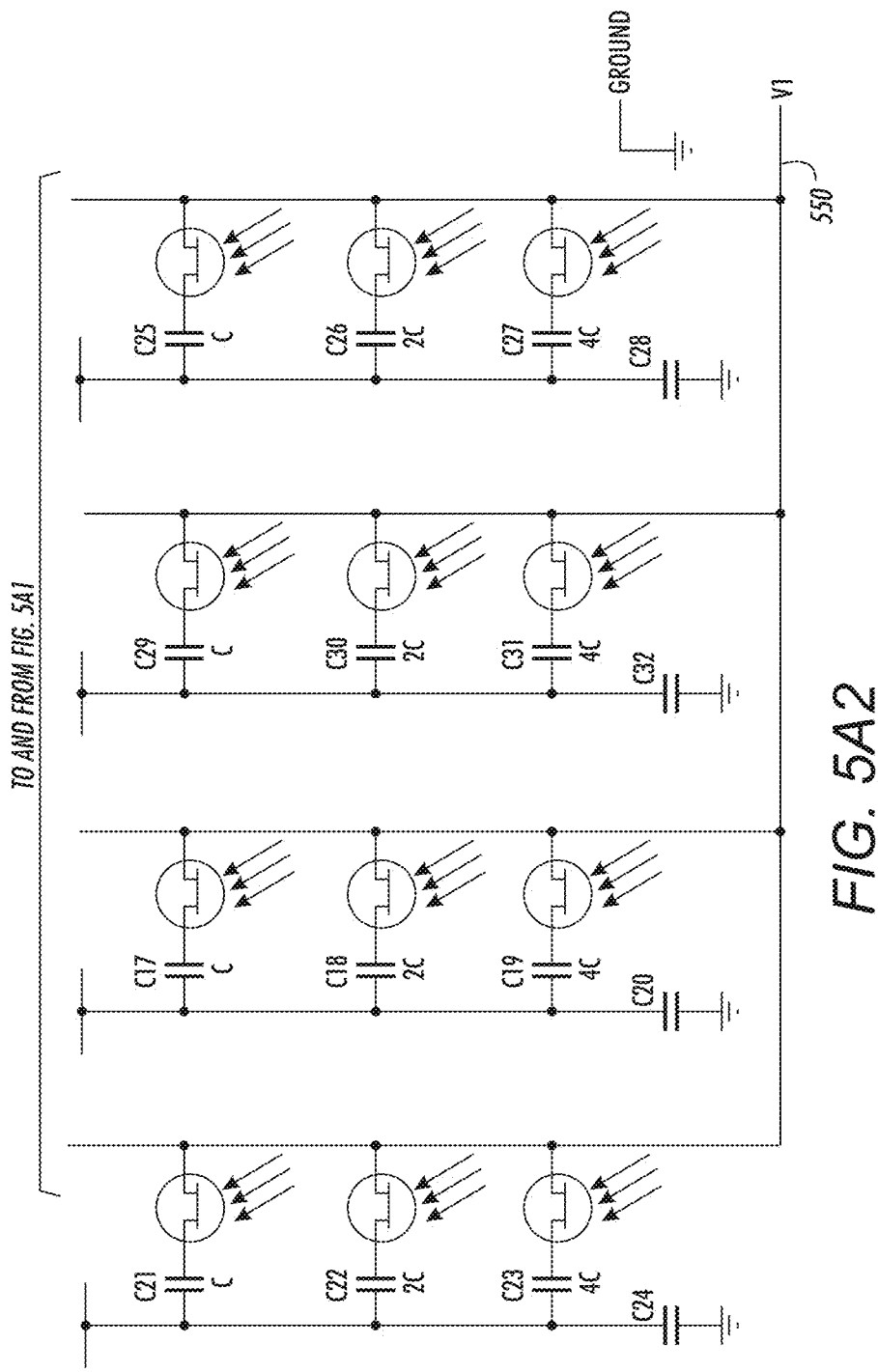
FIG. 5A2

ACTIVE MATRIX BACKPLANE FORMED USING THIN FILM OPTOCOUPLERS

TECHNICAL FIELD

This disclosure relates generally to active matrix arrays and to devices and methods related to such arrays.

BACKGROUND

Active matrix arrays provide a way to access a large number of electronic elements. These arrays have typically been used to address high density light emitting elements such as a liquid crystal display (LCD) or an organic light emitting diode (OLED) display. The active matrix array backplanes used to access the LCD or OLED display element have been made thin to facilitate flat panel displays. Active matrix addressing can also be useful to control electronic elements that are actuated by high voltages. High voltage applications often involve the use of some type of electrical isolation between control and output circuits. There is a need for high density active matrix arrays that are useful for high voltage applications.

SUMMARY

Some embodiments involve a device that includes a backplane having multiple output terminals arranged in an array on an output surface of the backplane. The device includes an active matrix array comprising thin film solid state optical switches coupled respectively between an input terminal of the backplane and the output terminals. Storage capacitors may be coupled respectively to the output terminals. A pixelated light source provides pixelated light that controls the optical switches.

Some embodiments relate to a backplane that includes multiple output terminals arranged on an output surface of the backplane and an active matrix array comprising thin film solid state optical switches coupled respectively between at least one input terminal of the backplane and the output terminals which are arranged in an array. Each optical switch includes a layer of photo sensitive material that extends laterally; first and second electrodes spaced apart laterally from one another along the layer of photo sensitive material, the first and second electrodes contacting the photo sensitive material at first and second junctions, respectively; and at least one field plate electrically insulated from the photo sensitive material and extending laterally along the layer of photo sensitive material and beyond the first and second junctions, wherein the at least one field plate is electrically connected to the first electrode or the second electrode.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

FIGS. 5A1 and 5A2 is a circuit diagram of an optocam backplane that includes a digital to analog converter in each pixel in accordance with some embodiments;

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Embodiments disclosed herein are directed to high density backplanes that provide optocoupled, high voltage outputs. Optocoupling serves to isolate the high voltage nodes from the low voltage control system. Large area optocoupled backplanes are capable of providing arrays of high voltage outputs and present opportunities for wide variety of applications including driving microelectromechanical (MEMS) devices such as membrane displays and optical mirror arrays. Some embodiments discussed are directed to optocoupler active matrix (optocam) backplanes, that can include a large number of pixels, e.g., 500×500, 1000×1000, or more, with an array pitch of less than about 100 µm. In various embodiments, the optical switches of the optocam backplane can be controlled by pixelated light generated a flat panel display or a projector. Some embodiments discussed herein involve novel thin film optical switches that can be used to provide the optocoupling for the optocam backplane.

Figure 1:
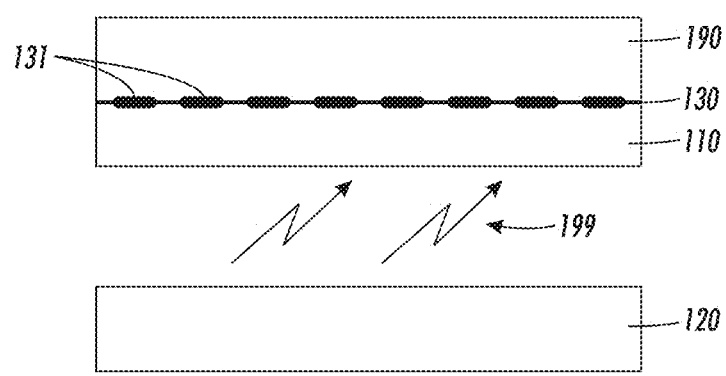
FIG. 1 is a block diagram of a system that uses a optocoupler active matrix (optocam) backplane in accordance embodiments discussed herein.

FIG. 1 is a cross sectional view of an exemplary system that incorporates an optocam backplane 110 in accordance with various embodiments discussed herein. The optocam backplane 110 has an output surface 130 that includes an array, e.g., a multi-dimensional array, a two dimensional, or xy array, of output terminals 131. The output terminals 131 can be coupled to drive a device 190, e.g., a MEMs array, etc.

Within the backplane 110, but not shown in FIG. 1, are thin film optical switches that couple an input voltage, e.g., a high voltage input, to the output terminals 130. Structures of thin film optical switches that can provide high voltage outputs and which are suitable for the optocam backplane are discussed in more detail below. The optical switches of the backplane 110 are controlled by light source 120 that generates pixelated light 199 to activate the optical switches of the backplane 110.

Figure 2:
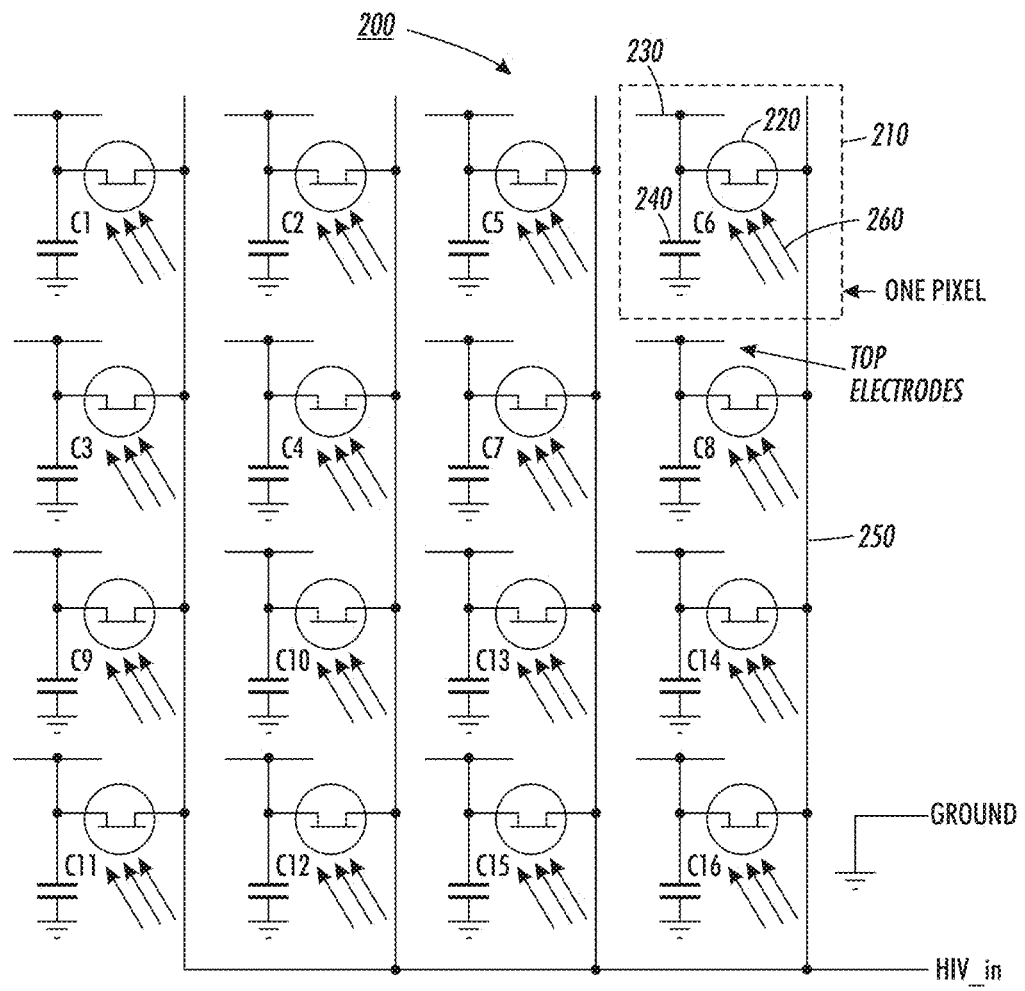
FIG. 2 is a circuit diagram of an optocam backplane in accordance with some embodiments.

FIG. 2 is a schematic diagram of an optocam backplane 200 showing a number of pixels 210 arranged in a two dimensional array. Each pixel 210 includes an optical switch, e.g., optical switches 220, that can be turned on or off by the presence or absence of light 260. When optical switch 220 is turned on, input 250, e.g., a high voltage input, is coupled to the pixel output terminal 230 through a low impedance and when the optical switch 220 is turned off, input 250 is decoupled from the pixel output terminal 230 by a high impedance between the input 250 and output terminal 230. Each pixel can include an output storage capacitor 240 coupled to the pixel output terminal 230. Instead of each column of pixels 210 being individually addressable, as is typical for row scanning active matrix switched LCD display backplanes, the input ("data") lines 250 of some or all the pixels 210 can be connected, providing a simplified 2 port electrical interface. Individual pixel addressing is accomplished by the on/off control of individual pixels of the pixelated light generated by a light source (not shown in FIG. 2) that is optically coupled to the optical switches 220. Although FIG. 2 shows an array of 4×4 pixels, the backplane 200 is scalable to 1K×1K pixels or more.

Figure 3:
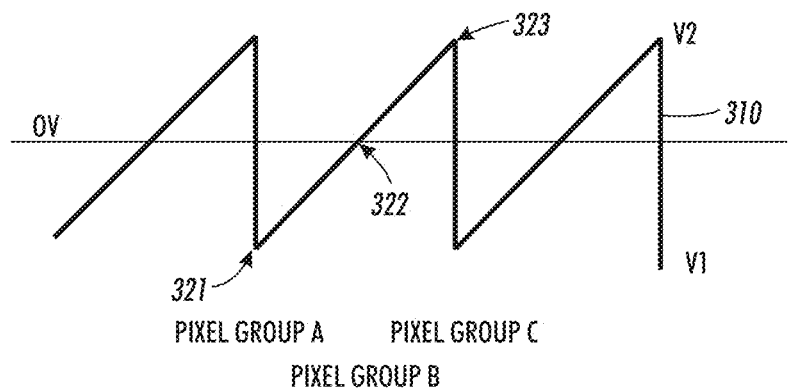
FIG. 3 illustrates an exemplary input waveform for the optocam backplane of FIG. 2.

In some embodiments, the each pixel 210 of backplane 200 has the capability of providing multiple voltage levels at the output terminal 230. The control light source does not need to produce multiple grey levels in order to achieve multi-level high voltage outputs on the output terminals 230 of the output terminal array. FIG. 3 shows an exemplary waveform 310 of the input line 250 driving voltage and portions of the waveform that provide the turn on timing 321, 322, 323 for groups A, B, C of pixels. In this particular example, V1 will be stored in the storage capacitor of pixel group A, 0 will be stored in the storage capacitor for pixel group B and V2 will be stored in the storage capacitor for pixel group C. V1 and V2 can have opposite polarity as illustrated or may have the same polarity as needed by the application. Any number of output voltage levels can be provided by this process, with more grey levels being possible at the expense of a reduced refresh rate.

Figure 4:
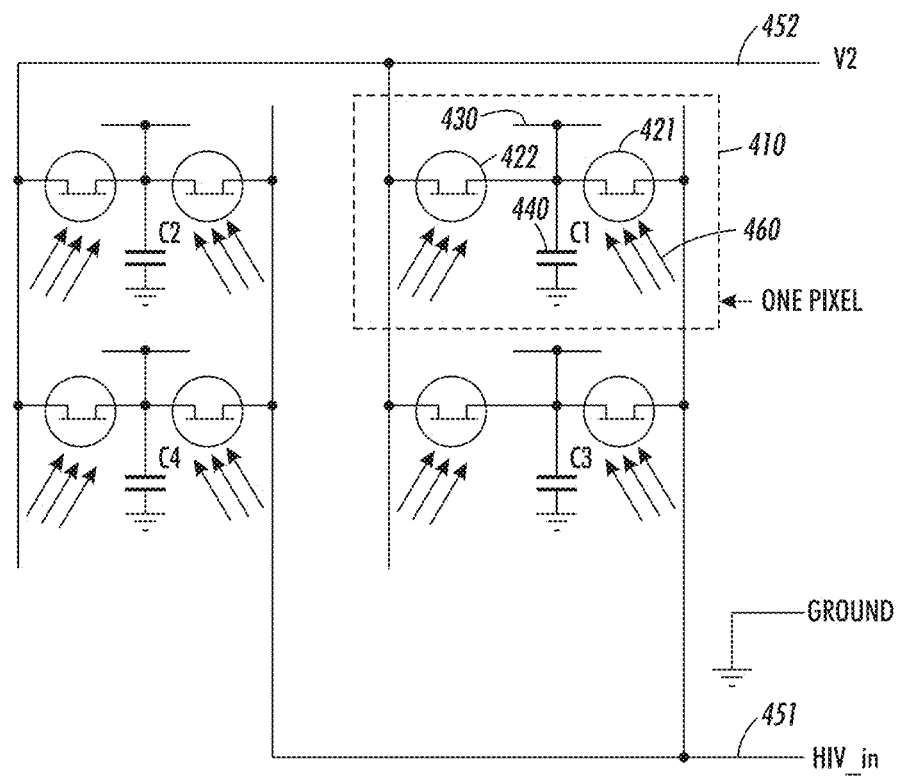
FIG. 4 is a circuit diagram of an optocam backplane that uses two sets of input lines and two optical switches per pixel in accordance with some embodiments.

FIG. 4 shows a schematic of an optocam backplane that provides multi-level output voltages. The optocam backplane of FIG. 3 includes multiple input lines 451, 452 and multiple optical switches 421, 422 in one pixel 410 to achieve multiple voltage levels. Each pixel 410 can include a storage capacitor 440 coupled to the optical switches 421, 422, and to the output terminal 430. By modulating the light controlling the optical switches 421, 422 in a pulse width modulation manner, the output voltage at the top output terminal 430 can be tuned to any level between V1 and V2.

Alternatively, some two dimensional (2D) light sources, such as OLED or LCD displays, are capable of generating grey level light outputs for each individual pixel. In embodiments which incorporate these types of light sources, any voltage between V1 and V2 can be generated by the relative light level of light source that control optical switches 421 and 422.

According to some implementations, V1 and V2 do not need to be DC or quasi-DC (no change during one of the light-source-on cycles). Instead, one or both of V1 and V2 can be driven by a high frequency voltage generator. In one example, V1 can be connected to a 1 MHz sinusoidal function generator and V2 can be connected to ground. Pixel groups with the light source pixel that energizes optical switch 421 turned on will output 1 MHz voltage on the top electrode, while the pixel groups with the light source pixel turned on that energizes optical switch 422 will output 0V. This configuration can enable devices or applications that require high frequency drive. For example, if the optocam backplane is used for an arbitrary micro-particle actuator, this approach enables dielectrophoretic actuation. The simpler optocam backplane shown in FIG. 2 is also capable of selectively outputting high frequency potentials to the top electrode. However, it does not provide selective "ground" electrodes, but rather, any backplane pixels not addressed with illumination will be connected to ground through the storage capacitor. For many applications, this should be sufficient.

Figure 5B:
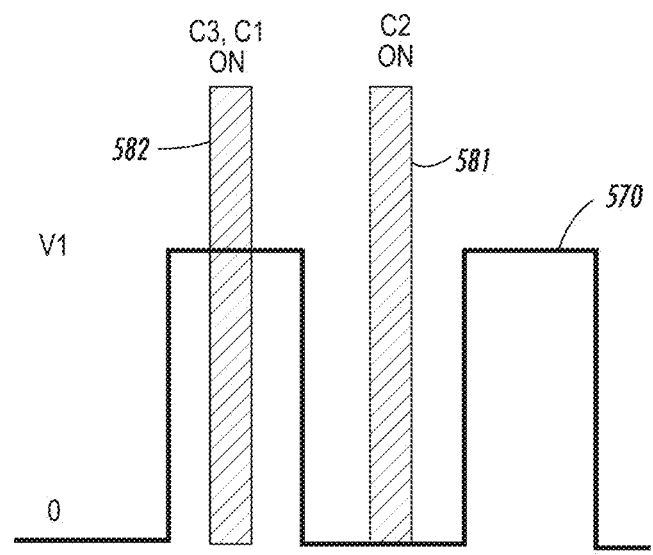
FIG. 5B illustrates a digital input waveform for the optocam backplane of FIG. 5A.

FIGS. 5A (5A1 and 5A2) and 5B illustrate yet another embodiment of generating multi-level high voltage outputs with only on/off control of individual light source pixels of the light source. Each pixel 510 of the optocam backplane includes a mini digital to analog converter (DAC) with an optical digital input. For example, FIG. 5A shows a backplane pixel configuration that has 3 bit digital input, each one controlled by an optical switch 521, 522, 523, and connected to a weighted capacitor 581, 582, 583. Storage capacitor 540 is electrically connected to the backplane pixel output terminal 530 and to each of the weighted capacitors 581, 582, 583. Optical switches 521, 522, 523 are turned on in a pattern that coordinates with the input voltage waveform. FIG. 5B shows the input waveform 570 applied to input terminal 571 of FIG. 5A. In the example shown in FIGS. 5A and 5B, optical switches 523 and 521 are turned on during time interval 582 when the input voltage waveform 570 is V1 and optical switch 522 is turned on during time interval 581 when input voltage waveform is 0. Using the timing pattern 581, 582 and input waveform 570 shown in FIG. 5B, the voltage at the output terminal 530 of pixel 510 is (5/7)*V1. The reader will appreciate that various other analog voltage levels may be achieved at the output terminal 530 depending on the timing pattern and input voltage waveform used.

Figure 6:
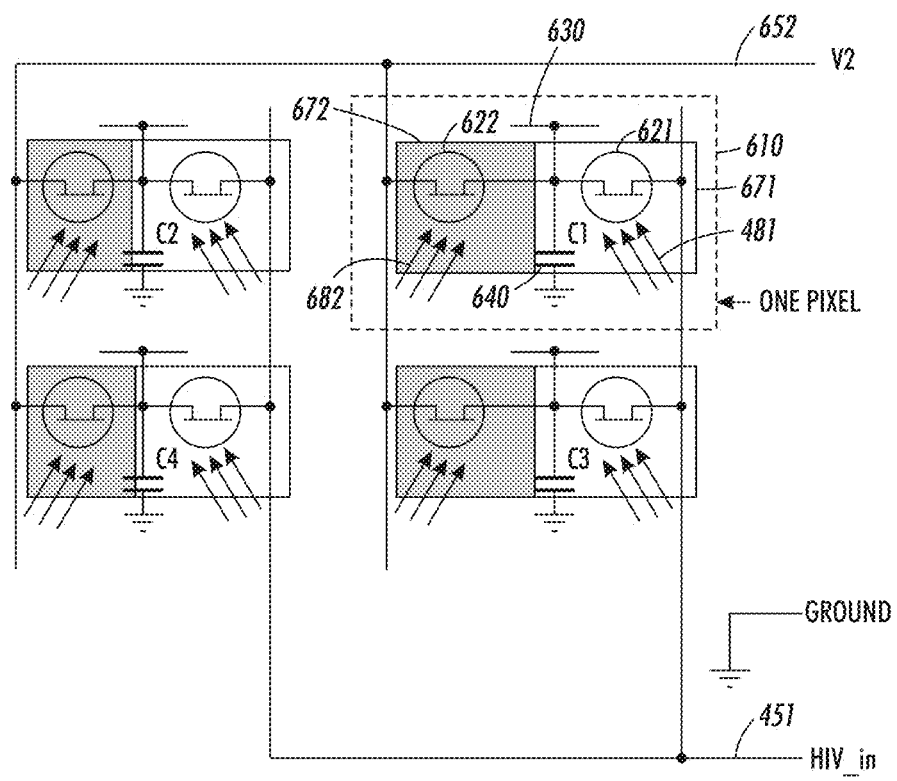
FIG. 6 is a circuit diagram of an optocam backplane that includes multiple color filters according to some embodiments.

FIG. 6 is a schematic diagram of an optocam backplane having a configuration that can be used instead of doubling the resolution requirement of the light source. In this embodiment, the light source is a 2D color light source such as a color display. Each pixel 610 includes two optical switches 621, 622. Color filter 671 is disposed between optical switch 621 and the light pixel that energizes the optical switch 621. Color filter 672 is disposed between optical switch 622 and the light pixel that energizes the optical switch 622, wherein the optical passband of color filter 671 is different from the optical passband of color filter 672. When light 681 of wavelengths within the passband of color filter 671 is directed towards the backplane pixel 610, optical switch 621 is on and optical switch 622 is off.

Conversely, when light 682 having wavelengths within the passband of color filter 672 is directed towards the backplane pixel 610, optical switch 622 is on and optical switch 621 is off. Thus, it is possible to use a color display to separately control each optical switch 621, 622 of the pixel 610. The color display is capable of emitting a substantial amount of light in the passband of color filter 671 without substantially emitting light in the pass band of color filter 672 and is capable of emitting a substantial amount of light in the passband of color filter 672 without substantially emitting light within the passband of color filter 671. Using a color display as the 2D light source it is possible to relax the resolution of the 2D light source needed to control the optocam backplane illustrated in FIG. 4 back to the resolution requirement of FIG. 2.

Figure 7:
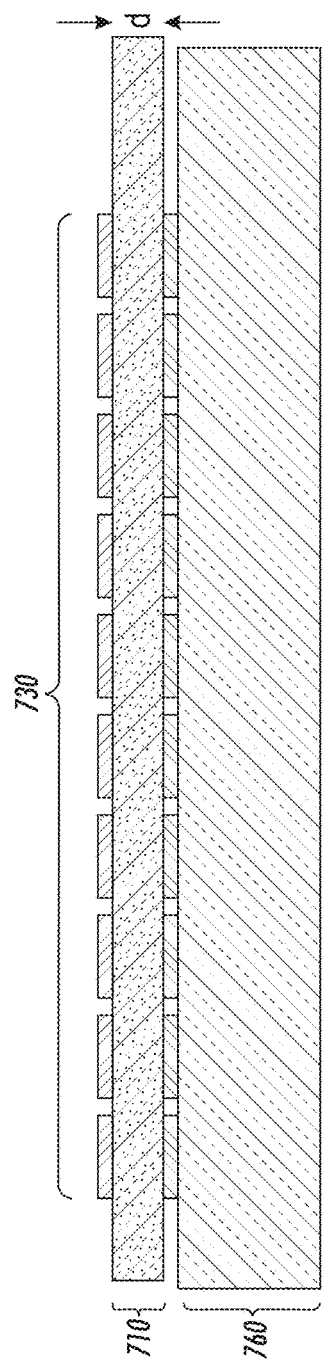
FIG. 7 is a side view of an optocam backplane using a flat panel display as the control light source in accordance with some embodiments.

FIG. 7 shows a side view of an optocam backplane 710 showing a cross section of the backplane 2D output terminal array 730. The optical switches of the optocam backplane 710 are controlled by a 2D light source, e.g. a flat panel display 760. In FIG. 7, the pixel pitch of the backplane 710 is substantially equal to the pixel pitch of the 2D light source 760 and the substrate thickness, d, of the backplane is sufficiently small such that crosstalk due to dispersion of light from the light source pixels is not significant. In this scenario, the light source 760 can be directly coupled to the optocam backplane 710 without intervening optics.

Figure 8:
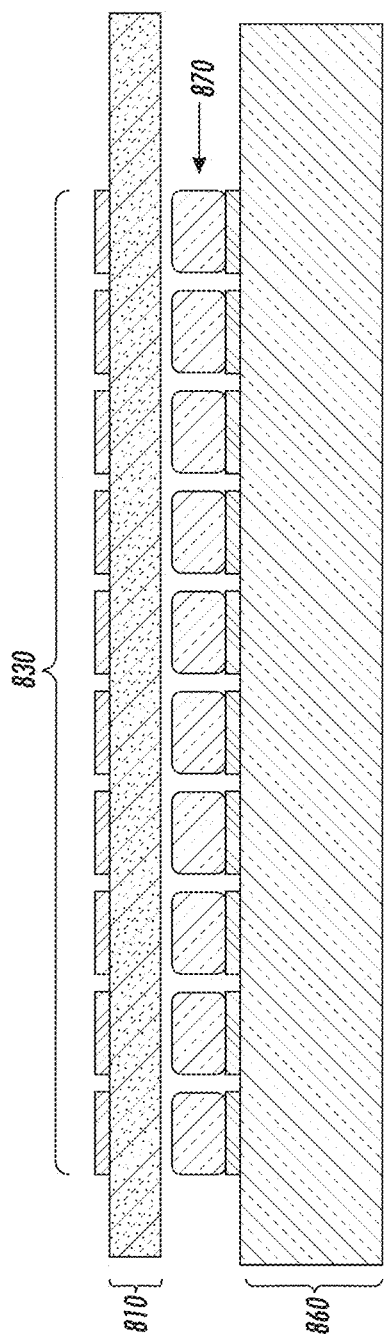
FIG. 8 is a side view of an optocam backplane using a flat panel display as the control light source and including optical elements disposed between the optocam backplane and the flat panel display in accordance with some embodiments.

FIG. 7 illustrates an embodiment wherein a flat panel display 760, e.g., organic light emitting diode (OLED) display or liquid crystal display (LCD), is directly optically coupled to the back of a optocam backplane 710. As long as the substrate thickness of the optocam backplane, d, is much smaller than the pixel pitch of the backplane optical switch array, this approach should be sufficient. Taking advantage of current trends in thin transparent substrates developed in current display industry, this approach is may be useful. If the required array pitch is smaller than the substrate thickness, appropriate relay optics 870, shown in FIG. 8 may be used. The relay optics 870 are shown disposed along a surface of the backplane 810 opposite from the output terminals 830. For example, the relay optics 870 may comprise a pinhole mask to block dispersed light and/or a micro lens array, e.g., a selfoc lens array, configured to focus light from the display 860 onto the optical switches of the optocam backplane 810.

Figure 9:
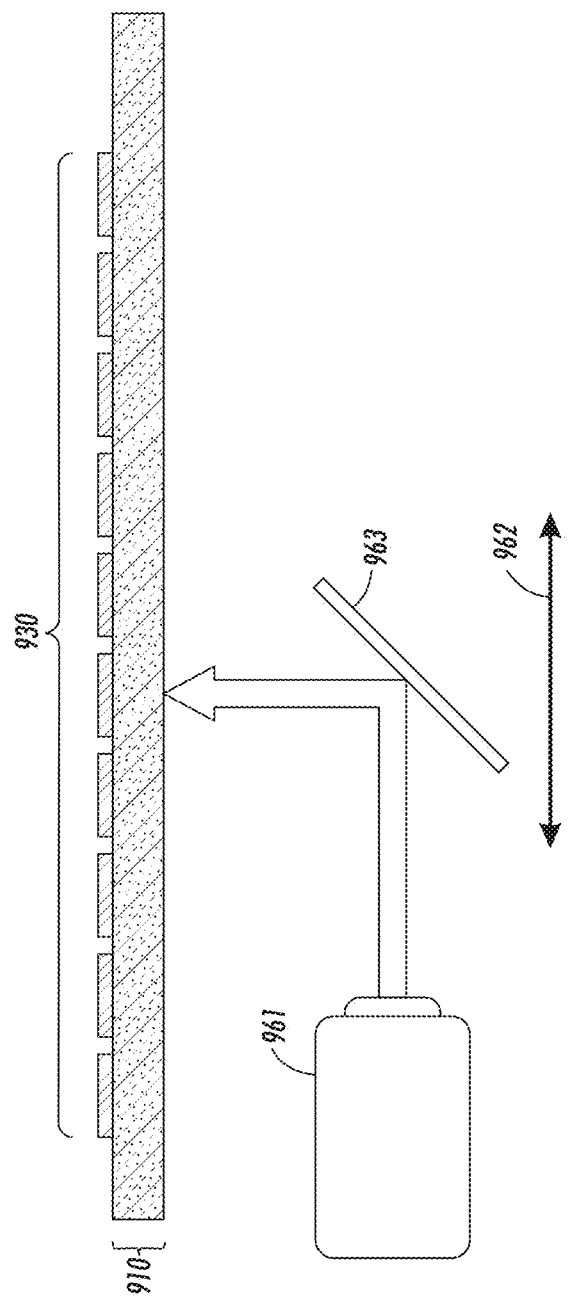
FIG. 9 illustrates an optocam backplane and a projector used as the control light source in accordance with some embodiments.

FIG. 9 shows a configuration that uses a projector system including a projector 961 used as the light generating device, a tilted mirror 963, and a scanning mechanism 962 configured to translate the tilted mirror along one or more axes. The projector 961, mirror 963, and scanning apparatus 962 can provide the pixelated 2D light source for controlling the optical switches of the optocam backplane 910 to provide a desired pattern output at the output array 930 of the optocam backplane. Compared to the configuration shown in FIG. 7, for example, a projector system usually requires bulkier optics. The projector system provides several useful features. For example, if an optocam backplane with single optical switch pixels as in FIG. 2 is used, optical zoom of the projector can be used to generate potential map patterns that can be easily scaled, independent of the pre-designed array pitch. The mirror and the projector can also be engineered to scan in 1D or 2D in real time such that a large pattern field can be provided.

As an alternative to the projector, mirror, and scanning apparatus of FIG. 9, it is possible to use a digital light projector (DLP) system, which incorporates many pixel sized rotatable micro-mirrors with a scanning mechanism that tilts the mirrors toward or away from the light beam generated by the projector, thus turning the optical switches on or off.

Figure 10:
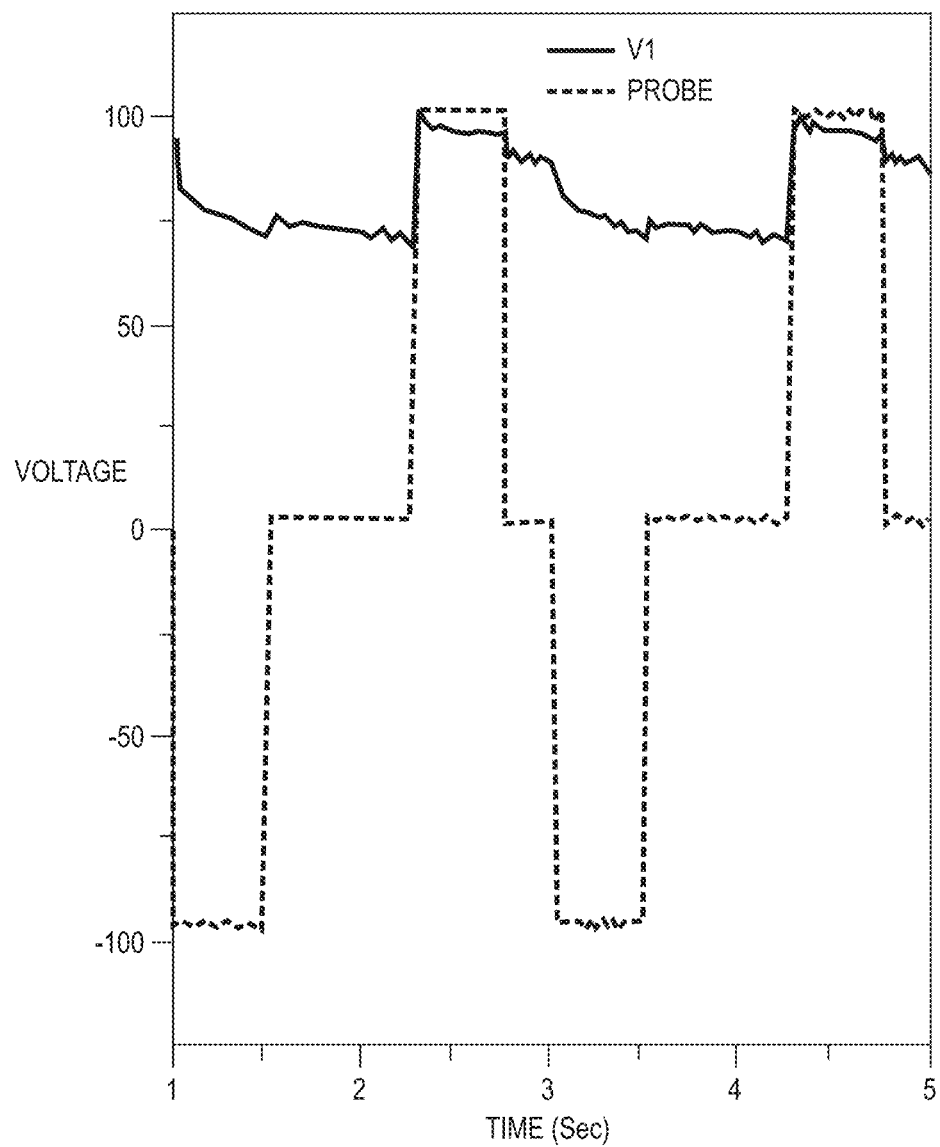
FIGS. 10 and 11 are measured waveforms of an optocam backplane in accordance with some embodiments.
Figure 11:
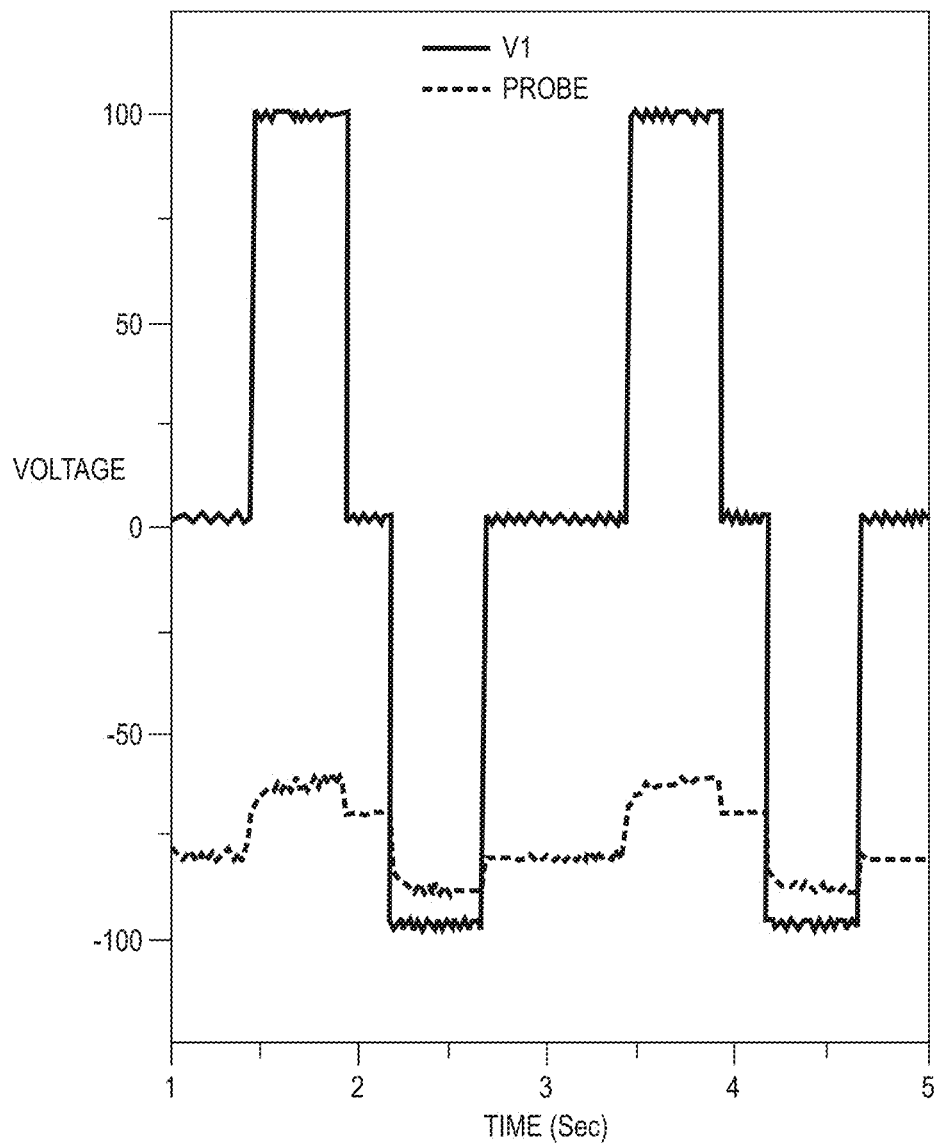

FIGS. 10 and 11 are graphs that illustrate the operation of an optocam backplane that has the pixel circuit and connection as shown in FIG. 2 and the 2D optical source as shown in FIG. 9. The measurements were performed with an oscilloscope (TDS2014B) and a high impedance voltage probe (Trek 800 high impedance Voltmeter). FIG. 10 shows the signal detected by a probe hovering above a light square that is turned on 0.1 s, in sync with the positive rising edge of V1. FIG. 11 shows a similar measurement but the probe is hovering above a light square that is turned on 0.1 seconds, in sync with the falling edge of negative V1 cycle. Both FIGS. 10 and 11 show the pixels are charged to the designed voltage rapidly and decay slowly (following the voltage of V1) when the optical light source is turned off, which is what is expected for the optocam backplane operation. The refresh rate of this measurement was 2 seconds, however, for practical applications, a much higher refreshing rate can be used to minimize the rippling of voltage outputs.

Figure 12:
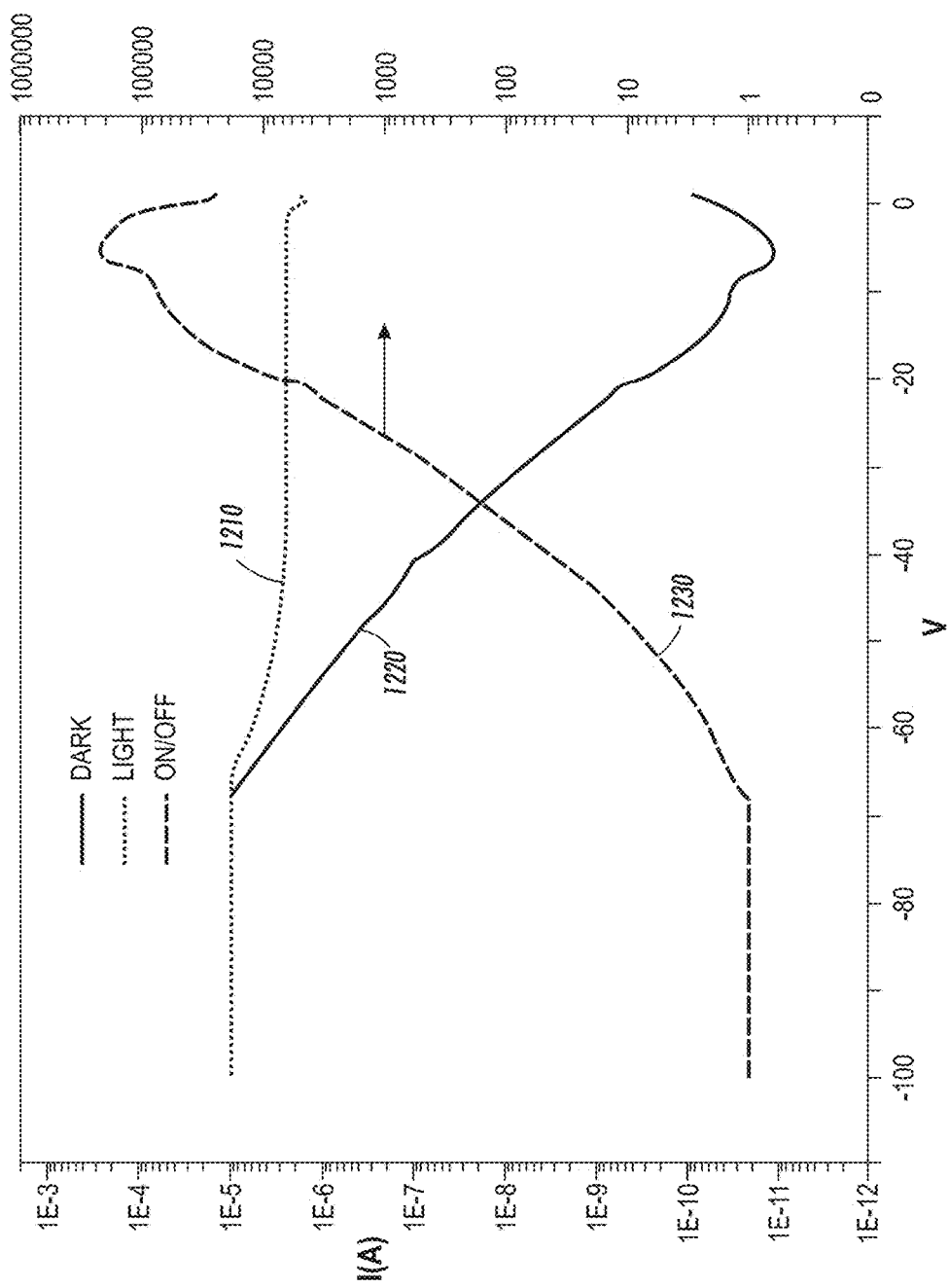
FIG. 12 shows graphs of the dark and light current for a standard PIN photosensor.

Applications of the optocam backplane described above include high voltage switching to control devices such as MEMs devices. High voltage switching is usually not compatible with standard VLSI processes. One technique for isolating high voltage from low voltage circuits involves the use of an optocoupler. However, as illustrated by FIG. 12, standard PIN photosensors are unsuitable for high voltage applications because of their high leakage current at high reverse bias voltage. FIG. 12 is a graph of dark and light IV characteristic of a standard PIN (i-a-Si:H) photosensor having an area of 1 mm$^2$ and a thickness of 1 μm. As shown in FIG. 12, the on/off ratio drops quickly for |V|>20V and drops to below 10 after 50V.

Embodiments disclosed herein include thin film semiconductor optical switches that can be used in various applications, including the optocam backplane previously discussed. Suitable structures for the thin film optical switches described herein can be similar in some respects to the structure of thin film transistors (TFTs). A thin film transistor (TFT) is a three terminal device made by depositing thin films (e.g. having thicknesses in a range of about 1 nm to 10 μm) of active semiconductor layers, dielectric layers, and metallic contacts over a non-conducting supporting substrate.

However, the thin film optical switches according to the various embodiments differ from thin film transistors in that they are configured to operate as two terminal devices, relying on lateral conduction in thin film semiconductors under illumination to build high voltage photoconducting devices for high voltage optocouplers, targeting applications that require ultralow leakage currents (about 1 pA at 100V). Some embodiments described below involve thin film constructions, and some are based on a lateral p+/i/p+ structure.

The thin film optical switches described herein include one or more field plates that shield the junction between the photosensitive material and at least one of the first and second laterally spaced electrodes. The field plate can be electrically connected to the electrode through vias or extension of the electrodes. The thin film optical switches disclosed herein provide a simple and effective solution that can be used in thin film optocoupler backplanes. The designs disclosed rely on illumination to control the lateral conduction. These configurations obviate the need for any extra voltage source to control transistor gates, which might lead to high voltage cross overs that can potentially create shorts.

The thin film optical switch configurations described herein have similar on/off ratios of greater than about 500, greater than about 750, or even greater than about 1000 over a voltage range from −100 to +100, at illumination levels of 500 cd/m$^2$. The thin film optical switches were tested using a microscope light that provided typical illumination conditions, about 7×10$^{13}$ photons/second. The illumination level is the same for the measurements of FIGS. 12, 15, and 17. The dark state leakage current of the optical switch may be less than about 1×10$^{-12}$ amperes at +/−100 V between the first and second electrodes.

Figure 13A:
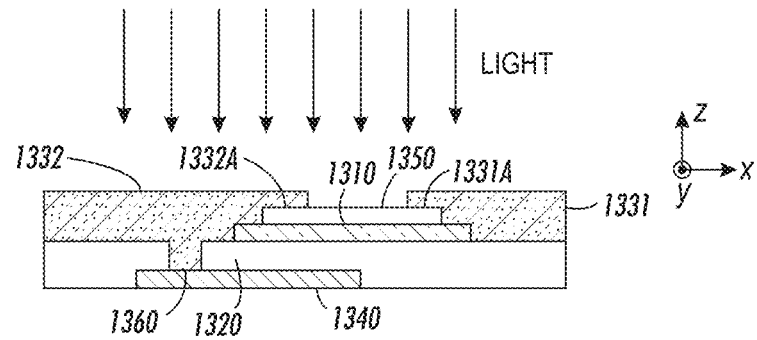
FIGS. 13A and 13B show cross sectional and top views of a thin film optical switch in accordance with some embodiments.
Figure 13B:
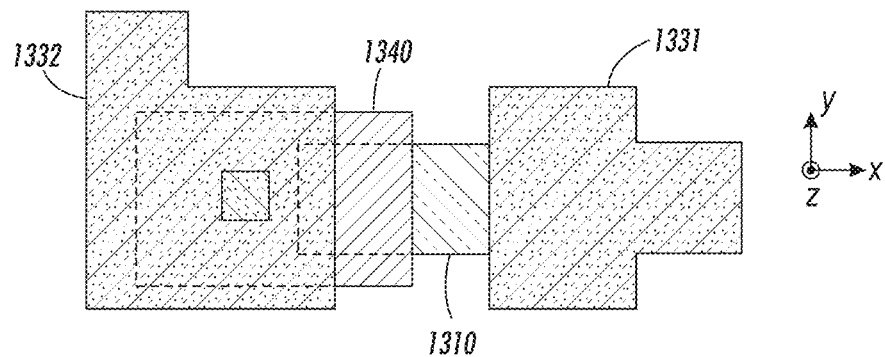

FIGS. 13A and 13B show the cross section and lateral device structure, respectively, of the thin film optical switch which can be fabricated using a thin film compatible process. The optical switch includes an insulating layer 1320, e.g., nitride, upon which a photo sensitive layer 1310, e.g., a-Si:H, is disposed. First and second electrodes 1331, 1332 (e.g., source and drain electrodes comprising a metal, metal alloy, transparent conductor, or doped n+ material) are offset laterally with respect to the photo sensitive layer 1310. The electrodes 1331, 1332 contact the photo sensitive layer 1310 at junction regions 1331a, 1332a. An insulating layer, e.g., nitride layer 1350, may be disposed over the photo sensitive layer 1310.

A field plate 1340 extends in the x and y directions along the photo sensitive layer 1310. The field plate 1340 is electrically insulated from the photo sensitive layer 1310 by the insulator layer 1320 and is electrically connected to electrode 1332 at connection 1360. The field plate 1340 extends laterally in x and/or y directions by at least a width that is larger than the separation along the z axis between the field plate and the photo sensitive semiconductor 1310 in the junction region 1332a in FIG. 13A. This separation between field plate 1340 and photo sensitive semiconductor 1310 can be in the range of about 100 nm to about 1 µm. The extension beyond the junction region 1332a in x and/or y directions can be greater than about 2 times of thickness (along the z axis) of the insulator 1320 in the junction region 1332a. The thickness along the z axis of the photo sensitive semiconductor layer 1310 may be in the range of about 50 nm to about 1 µm. The thickness along the z axis of insulator 1320 in the junction region 1332a may be about 100 nm to about 1 µm. The thickness of field plate along the z axis may be between about 100 nm to a few microns.

The field plate 1340 having this configuration mitigates Poole Frenkel leakage current. The field plate 1340 is configured to shield the junction region 1332a from high electric fields that might result from the high voltage drop between the two electrodes 1331, 1332. The field plate 1340 may comprise a metal or may comprise a transparent conductive material such as indium tin oxide (ITO) to enhance optical response when light is shining from the bottom of the device as oriented in FIG. 13A. The illumination (LIGHT) in FIG. 13A is drawn shining from the top as oriented in FIG. 13A but in some configurations, the illumination can be shining from the bottom or can be shining from both top and bottom of the device. The electrodes 1331, 1332 may comprise a transparent conductive material in some embodiments.

Figure 14:
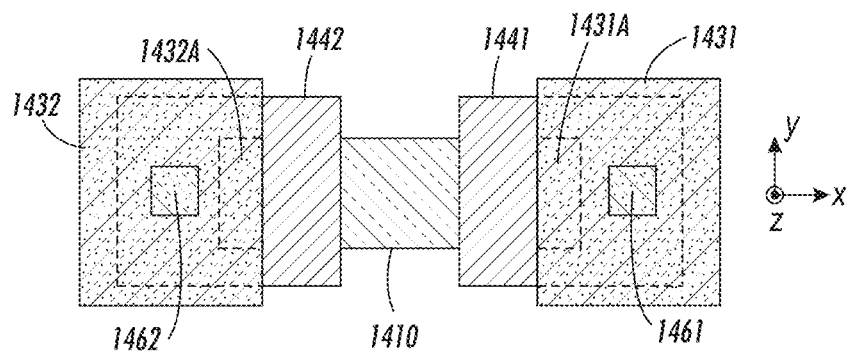
FIG. 14 is a top view of a thin film optical switch that includes two field plates according to some embodiments.

FIGS. 13A and 13B illustrate a device with one field plate that is designed to provide high voltage shielding in one bias direction. FIG. 14 shows the lateral structure of a device with two field plates 1441, 1442. The device of FIG. 14 is designed to provide high voltage shielding in both bias directions. The field plates 1441, 1442 are configured to shield the junction regions 1431a, 1432a from high electric fields that might result from the high voltage drop between the two electrodes 1431, 1432.

The device of FIG. 14 includes a photo sensitive layer 1410 with electrodes 1431 and 1432 contacting the photo sensitive layer 1410 at junctions 1431a and 1432a. Field plates 1441, 1442 extends in the x and y directions along the photo sensitive layer 1410. Field plates 1441, 1442, are electrically insulated from the photo sensitive layer 1410 by an insulator layer and are electrically connected to electrodes 1431, 1432 at connections 1461, 1462. The field plates 1441, 1442 extend beyond the respective junction regions 1431a, 1432a. For example, each of the field plates 1441, 1442 may extend laterally in x and/or y directions by at least a width that is larger than the separation of the field plate 1441, 1442 and the photo sensitive semiconductor in the junction region 1431a, 1432a in FIG. 14. The separation between field plate 1441, 1442 and photo sensitive semiconductor 1410 is typically in the range of about 100 nm to 1 µm. The extension beyond the junction region in x and y direction is usually greater than about 2 times of thickness of the insulator layer. The thickness of the photo sensitive semiconductor layer 1410 is in the range of about 50 nm to about 1 µm. The thickness of insulator is typically about 100 nm to about 1 µm. The thickness of field plate 1441, 1442 is typically between about 100 nm to a few microns.

Figure 15:
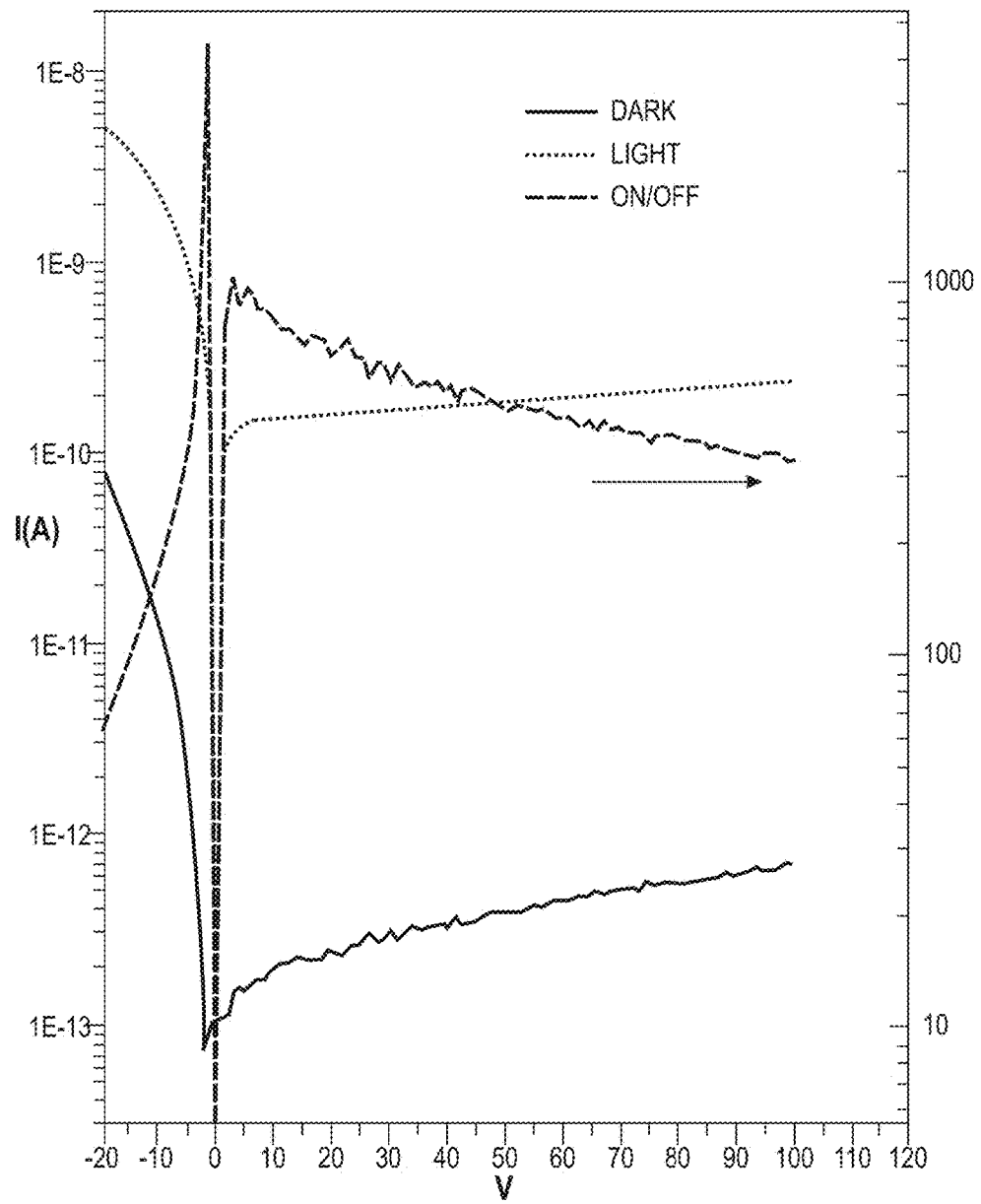
FIG. 15 provides dark and light IV characteristics for the optical switch illustrated in FIGS. 13A and 13B.

FIG. 15 shows the dark and light IV characteristics and the on/off ratio of a device having the configuration of FIGS. 13A and 13B. The device tested uses MoCr as the electrode metal, which blocks some light but diffused light is sufficient to turn on the device.

Figure 16A:
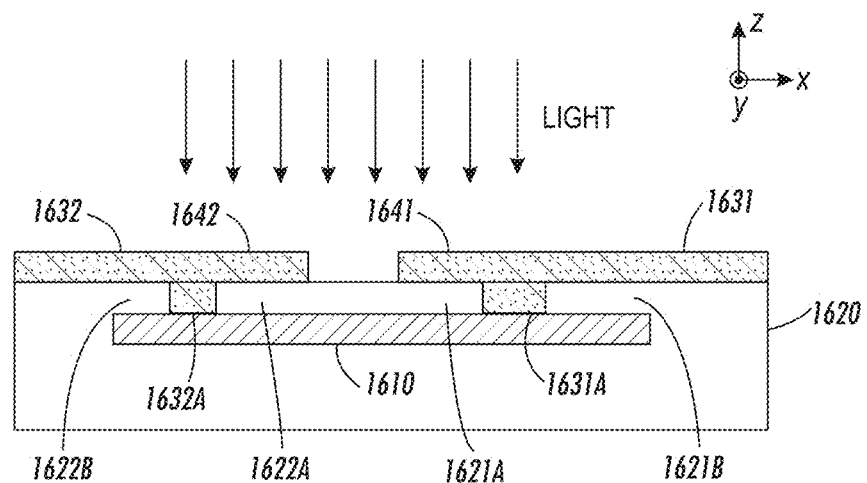
FIGS. 16A and 16B show cross sectional and top views of an optical switch having a p+/i/p+ structure in accordance with some embodiments.
Figure 16B:
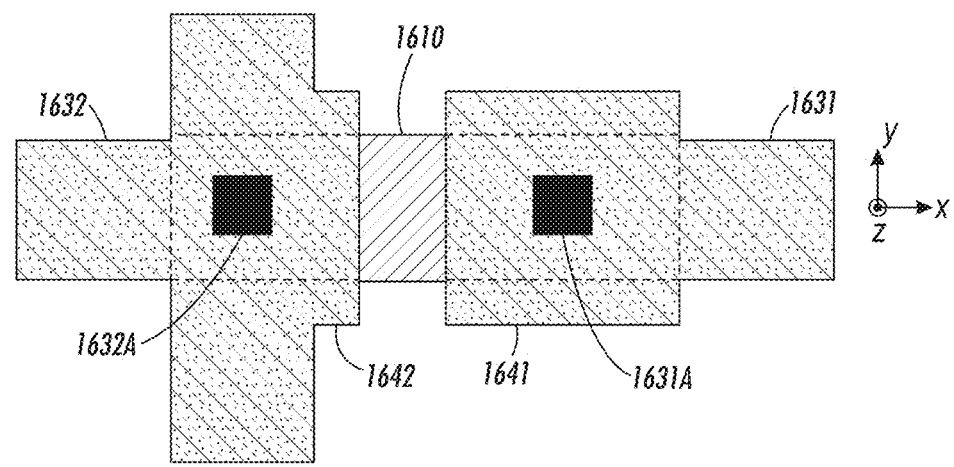

FIGS. 16A and 16B show the cross section and lateral device structure, respectively, of an optical switch based on a p+/i/p+ structure that includes field plates integrated into the source and drain electrodes. Although a lateral p+/i/p+ structure is shown in this example, those skilled in the art will appreciate that other structures with laterally spaced electrodes may be used, for example, in some embodiments, the device could have a lateral p+/n−/p or a lateral n+/p−/n+ structure. The device includes a photo sensitive layer 1610, e.g., a-Si:H, disposed on an insulating layer 1620, e.g. a nitride layer. The p+/i/p+ layers are laterally spaced apart. First and second electrodes 1631, 1632 (e.g., source and drain electrodes) are spaced apart laterally with respect to the photo sensitive layer 1610 and contact the photo sensitive layer 1610 at first and second junction regions 1631a, 1632a, respectively. In various embodiments, the electrodes 1631, 1632 may comprise a metal, metal alloy, e.g., MoCr, a p+ doped material, or a transparent conductor such as ITO.

Field plates 1641, 1642 extend laterally beyond the junction regions 1631a, 1632a, and are electrically connected to electrodes 1631, 1632, respectively. The field plates 1641, 1642 are electrically insulated from the photo sensitive layer 1610 by insulator regions 1621a,b, 1622a,b. The field plates 1641, 1642 may extend beyond the junction regions 1631a, 1632a over one or more of the insulator regions for greater than about 2 times the thickness of the insulator layer 1621a,b, 1622a,b between field plate and photo sensitive semiconductor. The insulator layer 1621a,b, 1622a,b may have a thickness, for example between about 100 nm to 1 µm near the junction regions 1631a, 1632a. The thickness of the photo sensitive semiconductor layer 1610 in the may be between about 50 nm to 1 µm. The field plate 1641, 1642 may be about 100 nm to 1 µm thick.

Figure 17:
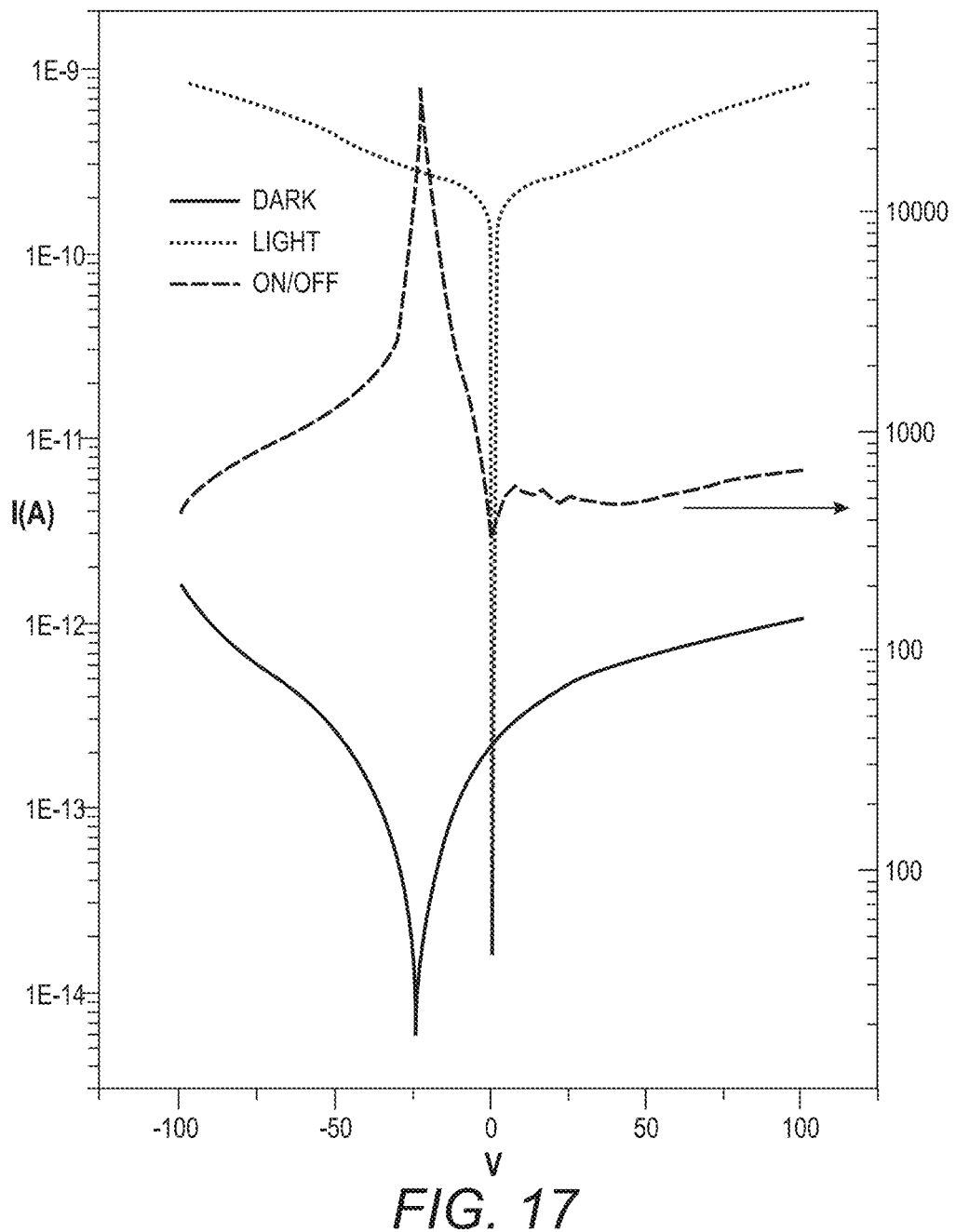
FIG. 17 provides dark and light IV characteristics for the optical switch illustrated in FIGS. 16A and 16B.

FIG. 17 shows the dark and light IV characteristics and on/off ratio of a device having the structure of FIGS. 16A and 16B. Roughly three orders of magnitude is observed through −100 to +100 V bias. The zero crossing of the dark IV characteristic was shifted to −25V because of the relatively high sweeping rate.

Optical switches disclosed herein are designed to use lateral photoconductivity plus one or more field plates to shield the semiconductor junction from high electric fields. The disclosed structures provide optical switches compatible with high voltage applications. These optical switches are compatible with large area processes and can include light sensitive undoped semiconductors such as i-a-Si:H, for example. The two electrodes (e.g., source and drain) are offset laterally with respect to the semiconductor layer. The light sensitive semiconductor layer can be planar, or, in some embodiments, the light sensitive semiconductor layer can be conformally deposited over one or more non-planar substructures, such as a mesa sub-structure.

The junction between the photo sensitive semiconductor layer and one or both of the electrodes is covered by a field plate that is at the same potential as the electrode, shielding the electrode to semiconductor junction. In various embodiments, the control light feeds from the top, bottom or both the top and bottom of the optical switch.

The foregoing description of various embodiments has been presented for the purposes of illustration and description and not limitation. The embodiments disclosed are not intended to be exhaustive or to limit the possible implementations to the embodiments disclosed. Many modifications and variations are possible in light of the above teaching.

What is claimed is:

1. A device comprising:
a backplane, comprising:
multiple output terminals arranged on an output surface of the backplane;
an optocoupler active matrix array, comprising:
thin film solid state optical switches coupled respectively between an input terminal of the backplane and the output terminals, the optical switches and the output terminals arranged in an array; and
storage capacitors coupled respectively to the output terminals; and
a pixelated light source configured to provide pixelated light that controls the optical switches.

2. The device of claim 1, wherein the pixelated light source comprises:
at least one light generating device configured to provide a light beam;
at least one mirror; and
a movement mechanism configured to provide movement of the mirror along at least two dimensions.

3. The device of claim 1, wherein the pixelated light source comprises multiple light generating devices, each of the multiple light generating devices arranged to control at least one of the optical switches.

4. The device of claim 1, wherein the pixelated light source comprises:
at least one light generating device; and
a micro mirror array comprising multiple rotatable micro mirrors.

5. The device of claim 1, wherein the pixelated light source comprises a flat panel display, wherein each pixel of the flat panel display corresponds to a pixel of the active matrix array.

6. The device of claim 5, wherein an array of optical devices is disposed between the flat panel display and the active matrix array.

7. The device of claim 6, wherein the array of optical devices comprises at least one of a microlens array, a selfoc lens array, and a pinhole array.

8. The device of claim 1, wherein:
the optical switches are arranged in pixel groups, each pixel group including at least a first optical switch coupled to a first input and a second optical switch coupled to a second input, the first and second optical switches connected to a common output terminal and capable of being individually activated by the pixelated light source.

9. The device of claim 1, wherein:
the optical switches are arranged in pixel groups, each pixel group including at least a first optical switch coupled to a first input and a second optical switch coupled to a second input, the first and second optical switches connected to a common output terminal;
a first optical filter having a first passband color arranged between the pixelated light source and the first optical switch;
a second optical filter having a second passband color arranged between the pixelated light source and the second optical switch; and,
wherein the pixelated light source is configured to activate the first optical switch by emitting the first color and to activate the second optical switch by emitting the second color.

10. A device comprising:
a backplane, comprising:
at least one input terminal; and
multiple output terminals arranged in an array on an output surface of the backplane;
a voltage source coupled to the at least one input terminal and configured to provide a time varying input voltage at the at least one input terminal; and
an active matrix array configured to provide multiple voltage levels at the outputs based on the time varying input voltage, comprising:
thin film solid state optical switches coupled respectively between the at least one input terminal and the output terminals, each optical switch comprising:
a layer of photo sensitive material that extends laterally;
first and second electrodes spaced apart laterally from one another along the layer of photo sensitive material, the first and second electrodes contacting the photo sensitive material at first and second junctions, respectively; and
at least one field plate separated from the photo sensitive material by at least one insulator region and extending laterally along the layer of photo sensitive material and beyond the first or second junction, wherein the at least one field plate is electrically connected to the first electrode or the second electrode.

11. The device of claim 10, further comprising storage capacitors coupled to each of the output terminals.

12. The device of claim 10, wherein the optical switches are arranged in pixel groups, each pixel group including at least a first optical switch coupled to a first input terminal and a second optical switch coupled to a second input terminal, the first and second optical switches connected to a common output terminal; and
the voltage source is configured to provide a first input voltage, $V_{i1}$, at a first input terminal and to provide a second input voltage, $V_{i2}$, at a second input terminal.

13. The device of claim 12, wherein the active matrix array is configured to provide multiple voltage levels at the outputs, wherein the multiple voltage levels are between the first and second input voltages.

14. The device of claim 10, wherein the optical switches are arranged in pixel groups, each pixel group arranged to convert a digital input signal to an analog output signal.

15. A device comprising:
a backplane, comprising:
multiple output terminals arranged in an array on an output surface of the backplane; and
an active matrix array, comprising:
thin film solid state optical switches coupled respectively between at least one input terminal of the backplane and the output terminals, wherein each optical switch is configured to be individually addressed by on/off control of a pixel of a pixelated light source and comprises:
a layer of photo sensitive material that extends laterally;
first and second electrodes spaced apart laterally from one another along the layer of photo sensitive material, the first and second electrodes contacting the photo sensitive material at first and second junctions, respectively; and
at least one field plate separated from the photo sensitive material by at least one insulator region and extending laterally along the layer of photo sensitive material and beyond the first or second junction, wherein the at least one field plate is electrically connected to the first electrode or the second electrode.

16. The device of claim 15, wherein:
the device further comprises a voltage source coupled to the at least one terminal;
the at least one input terminal comprises a first input terminal and a second input terminal; and
the voltage source is configured to provide a periodically changing voltage at the first input terminal and to provide a constant voltage at the second input terminal.

17. The device of claim 16, wherein the second input terminal is held at 0V.

* * * * *